(12) United States Patent
Bhattacharyya

(10) Patent No.: US 6,466,471 B1
(45) Date of Patent: Oct. 15, 2002

(54) LOW POWER MRAM MEMORY ARRAY

(75) Inventor: Manoj Bhattacharyya, Cupertino, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/865,596

(22) Filed: May 29, 2001

(51) Int. Cl.[7] .................................................. G11C 7/02
(52) U.S. Cl. ............................. 365/55; 365/66; 365/209
(58) Field of Search ............................. 365/66, 74, 55, 365/97, 173, 209

(56) References Cited

U.S. PATENT DOCUMENTS

| | | | |
|---|---|---|---|
| 5,343,422 A | | 8/1994 | Kung et al. ................ 365/173 |
| 5,587,943 A | * | 12/1996 | Torok et al. ................ 365/158 |
| 5,745,408 A | | 4/1998 | Chen et al. ................. 365/173 |
| 5,894,447 A | * | 4/1999 | Takashima .................. 365/158 |
| 5,898,547 A | | 4/1999 | Fontana, Jr. et al. ........ 360/113 |
| 5,982,660 A | | 11/1999 | Bhattacharyya et al. .... 365/173 |
| 6,081,446 A | | 6/2000 | Brug et al. ................. 365/171 |
| 6,097,626 A | | 8/2000 | Brug et al. ................. 365/171 |
| 6,111,783 A | | 8/2000 | Tran et al. ................. 365/171 |
| 6,114,719 A | * | 9/2000 | Dill et al. .................. 257/295 |
| 6,130,835 A | | 10/2000 | Scheuerlein ............... 365/171 |
| 6,134,139 A | | 10/2000 | Bhattacharyya et al. .... 365/171 |
| 6,163,477 A | * | 12/2000 | Tran .......................... 365/158 |

* cited by examiner

*Primary Examiner*—David Nelms
*Assistant Examiner*—Thong Le

(57) ABSTRACT

An MRAM memory array has nonlinear word lines and linear bit lines. The word lines cross the bit lines at memory cell locations, and are substantially coextensive with the bit lines at the crossing points. When a current is passed through the word and bit lines, the magnetic fields generated by the word line and the bit line at a coextensive portion are substantially aligned. The magnitude of the resultant field is therefore greater than in conventional, orthogonally oriented fields. Because the addition of the fields generated by the word and bit lines is enhanced, smaller word and bit line currents can be utilized, which reduces the size required for the memory array. The memory array can also utilize memory cells having a magnetic layer for producing a transverse magnetic field. The transverse field is orthogonally oriented to the magnetic field generated by the word and bit lines, and increases the reproducibility of switching of the memory cell. The transverse field also reduces the current required to switch the memory cell.

19 Claims, 4 Drawing Sheets

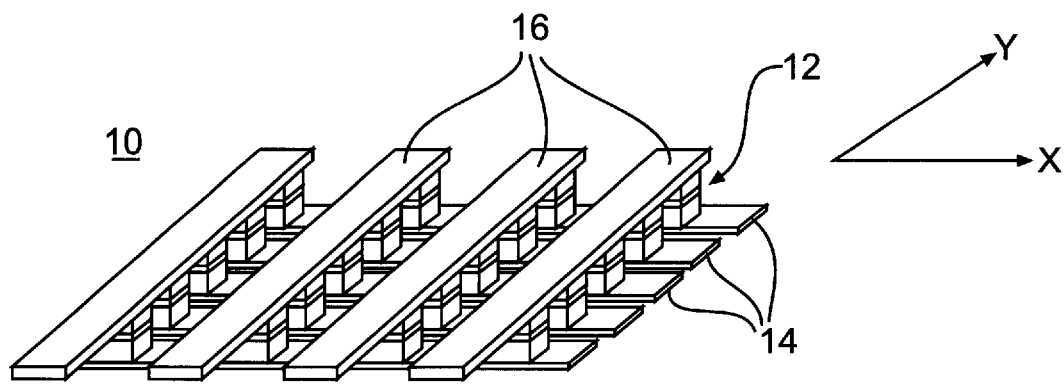
FIG. 1
RELATED ART
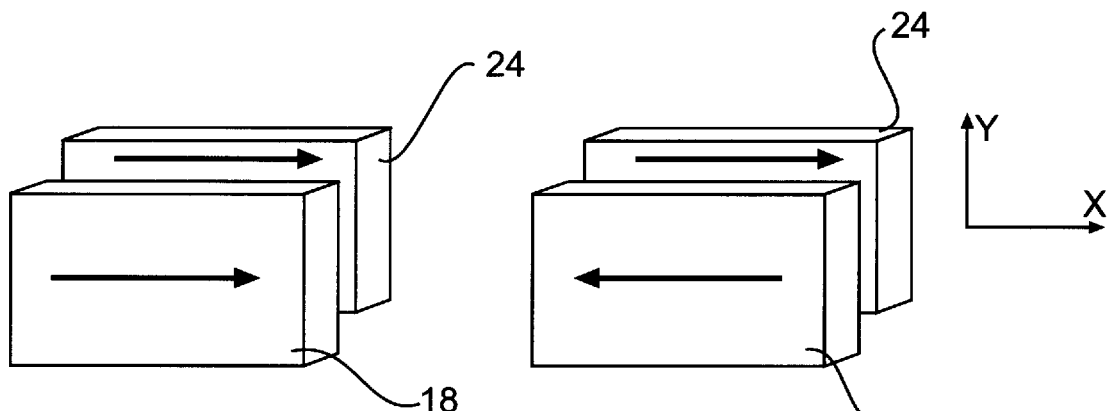
FIG. 2A
RELATED ART
FIG. 2B
RELATED ART
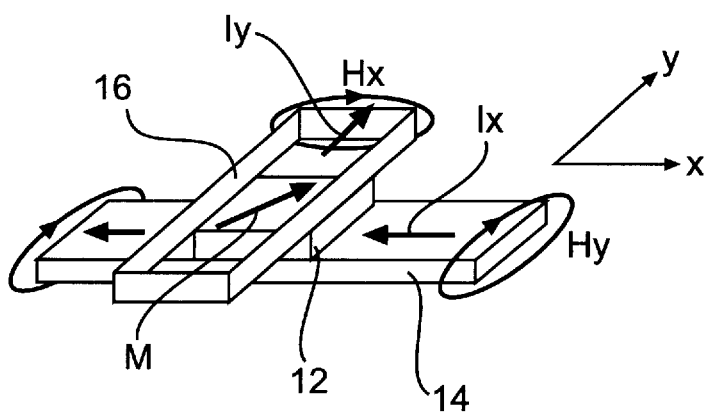
FIG. 3
RELATED ART

LOW POWER MRAM MEMORY ARRAY

TECHNICAL FIELD

The technical field is random access memory for data storage. More specifically, the technical field is magnetic random access memory arrays having reduced power requirements.

BACKGROUND ART

Magnetic Random Access Memory ("MRAM") is a type of non-volatile memory used for long term data storage. Accessing data from MRAM devices is much faster than accessing data from conventional long term storage devices such as hard drives. Additionally, MRAM is compact and consumes less power than hard drives and other conventional long term storage devices.

A typical MRAM device includes an array of memory cells. FIG. 1 illustrates a conventional memory cell array 10. The memory cell array 10 includes word lines 14 extending along rows of the memory cell array 10, and bit lines 16 extending along columns of the memory cell array 10. Memory cells 12 are located at a cross point of each word line 14 and bit line 16. Each memory cell 12 stores a bit of information as an orientation of a magnetization. The magnetization orientation of each memory cell 12 assumes one of two stable orientations at any given time. The two stable orientations, parallel and anti-parallel, represent the binary logic values of "1" and "0."

The magnetization orientation of a selected memory cell 12 is switched by supplying currents to a word line 14 and a bit line 16 that cross at the selected memory cell 12. The currents create magnetic fields that, when combined, switch the magnetization orientation of the selected memory cell from parallel to anti-parallel, or vice versa.

The magnetization orientation of the conventional memory cell 12 is illustrated by FIGS. 2A and 2B. A reference layer 24 and a data storage layer 18 determine the magnetization orientation of the memory cell 12. The magnetization of the data storage layer 18 can be oriented in either of the two directions indicated by the arrows on the data storage layer 18 in FIGS. 2A and 2B. The two possible magnetization directions are aligned with the "easy axis" of the data storage layer 18. The reference layer 24 includes a layer of magnetic material having fixed, or "pinned" magnetization (illustrated by the arrow on the reference layer 24). The reference layer magnetization is pinned in a direction parallel to the easy axis. Current supplied to a word line 14 and a bit line 16 crossing at the memory cell 12 switch the magnetization of the data storage layer 18 between the states illustrated by FIGS. 2A and 2B. The change in resistance due to the changing memory cell magnetization is detectable by a read circuit to determine the binary state of the memory cell 12.

As illustrated by FIGS. 1, 2A and 2B, the word lines 14 and the bit lines 16 are linear, and the easy axis of the data storage layer 18 is oriented parallel to the word lines 14.

FIG. 3 illustrates the fields generated by a conventional linear word line 14 and bit line 16, and the resultant magnetization M of a memory cell 12. The bit line 16 is shown in outline form so that the magnetization M of the memory cell 12 is visible in FIG. 3. A current Iy passing through the bit line 16 results in the magnetic field Hx. A similar magnetic field Hy is created when a current Ix passes through the word line 14. The magnetic fields Hx and Hy combine to switch the magnetic orientation of the memory cell 12.

Because the fields Hx and Hy are created by orthogonal currents, the magnitude of the switching field generated by the fields Hx and Hy is less than Hx+Hy. Therefore, the currents Ix and Iy are not fully utilized. For example, if the fields Hx and Hy are equal in magnitude, the resultant field is oriented 45 degrees from the word and bit lines 14, 16 and has a magnitude of about 0.7(Hx+Hy). The orthogonal relationship between the word and bit lines therefore results in higher current requirements for Ix and Iy in order to generate the required switching field.

High word and bit line currents are undesirable because memory array power consumption is a serious limiting factor in MRAM applications. High word and bit currents require larger bit and word lines and write circuits to handle the high currents. This results in larger, more expensive MRAM devices. Therefore, it is desirable to reduce the currents required for the word and bit lines.

A need therefore exists to reduce power consumption of MRAM memory arrays.

SUMMARY

A low power MRAM memory array having non-linear word lines and a permanent magnet layer that generates a transverse magnetic field satisfies the above need and achieves other advantages not present in conventional MRAM devices.

According to a first aspect, an MRAM memory array includes an array of memory cells, a plurality of nonlinear word lines extending in a first direction, and a plurality of substantially linear bit lines extending in a second direction. The word lines cross the bit lines at a plurality of memory cell locations, and the memory cells are located at the memory cell locations.

Also according to the first aspect, portions of the nonlinear word lines can be coextensive in the y direction with portions of the bit lines. Because the word and bit lines are coextensive in the y direction, the magnetic fields generated by currents in the word and bit lines are aligned in the x direction at the coextensive portions. The strength of a resultant magnetic field at a coextensive portion is thereby enhanced. In addition, the resultant field is more closely aligned with the easy axis of the memory cell located at the coextensive portion. Aligning the resultant field with the easy axis reduces the size of the field required to change the magnetization orientation of the memory cell. Therefore, smaller word and bit line currents can be used to switch the binary state of the memory cell, reducing the power consumption of the memory array.

According to a second aspect, each memory cell includes a transversely oriented magnetic layer having a magnetization oriented transversely to the easy axis of the memory cell. The transverse fields improve the reproducibility of switching of the memory cells, and reduce the word and bit line currents required to switch the memory cells.

Also, according to the second aspect, the transverse magnetic field can be applied at all times, so a permanent magnet can be used to form the transversely oriented magnetic layer. No current is required to generate the transverse magnetic field, further reducing the power consumption of the memory array.

Other aspects and advantages will become apparent from the following detailed description, taken in conjunction with the accompanying figures.

BRIEF DESCRIPTION OF THE FIGURES

FIG. 1 illustrates a conventional memory cell array.

FIG. 2 illustrates logic states of a conventional memory cell.

FIG. 3 illustrates magnetic fields generated at a conventional memory cell.

DETAILED DESCRIPTION OF PREFERRED EMBODIMENTS

An MRAM memory array will be discussed by way of preferred embodiments and by way of the figures.

Figure 4:
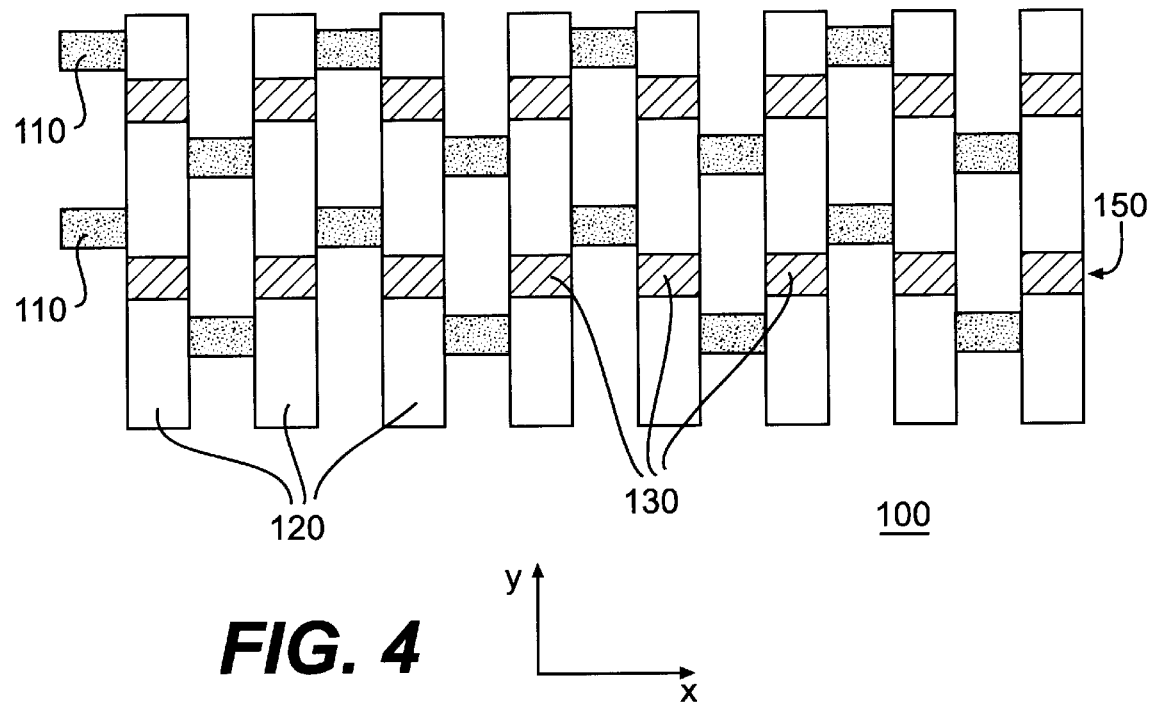
FIG. 4 is a plan view of an MRAM memory array embodiment.

FIG. 4 is a plan view of an MRAM memory array 100 having nonlinear word lines 110 and bit lines 120. In the memory array 100, the word lines 110 extend in a x direction, and the bit lines 120 extend in a y direction. The word lines 110 cross the bit lines 120 at memory cell locations 130 (shown by cross-hatching). The bit lines 120 are superimposed over the word lines 110, so only the portions of the word lines 110 bridging the gaps between the bit lines 120 are visible in FIG. 4. Reference numeral 150 indicates a memory cell, not visible in FIG. 4, sandwiched between a word line 110 and a bit line 120. A memory cell 150 is located at each of the cross-hatched memory cell locations 130, sandwiched between a crossed word line 110 and bit line 120.

In FIG. 4, two word lines 110 and eight bit lines 120, intersecting at sixteen memory cell locations 130, are shown for the purposes of illustration. In practice, arrays of 1024× 1024 memory cells and larger, for example, may be used.

The memory array 100 is responsive to a write circuit (not illustrated) for supplying currents to the word and bit lines 110, 120 during write operations. A read circuit may also be coupled to the memory array 100 to detect the binary state of the memory cells 150.

Figure 5:
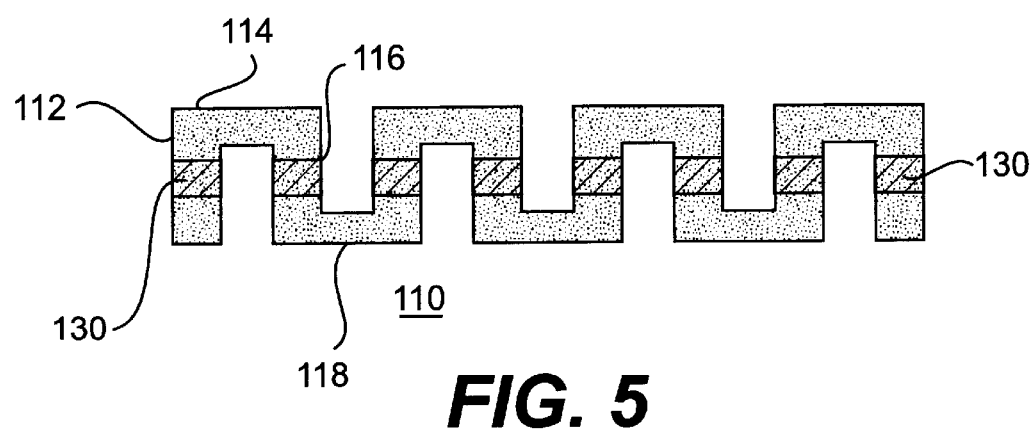
FIG. 5 is a plan view of a nonlinear word line according to an embodiment of the MRAM memory array.

FIG. 5 is a plan view of a nonlinear word line 110. In the embodiment of FIG. 5, the nonlinear word line 110 includes a first leg 112, a second leg 114, a third leg 116, and a fourth leg 118. The first through fourth legs 112, 114, 116, 118 are connected end-to-end, each leg orthogonal to an adjacent leg. The pattern of first through fourth legs 112, 114, 116, 118 repeats to form the nonlinear word line 110. When a nonlinear word line 110 is arranged in the MRAM memory array 100, the first legs 112 and the third legs 116 are coextensive in the y direction with portions of the bit lines 120.

Figure 6:
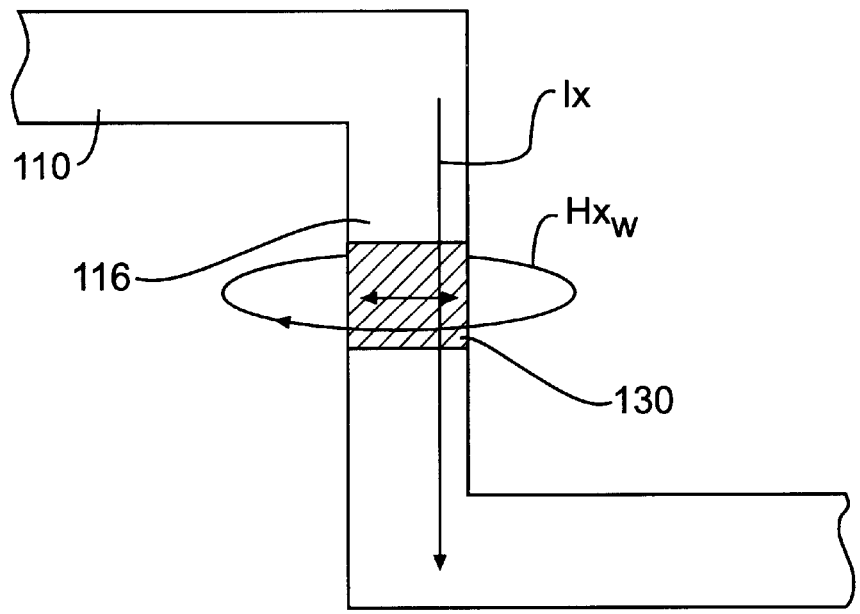
FIG. 6 illustrates a portion of a nonlinear word line according to an embodiment of the MRAM memory array.
Figure 7:
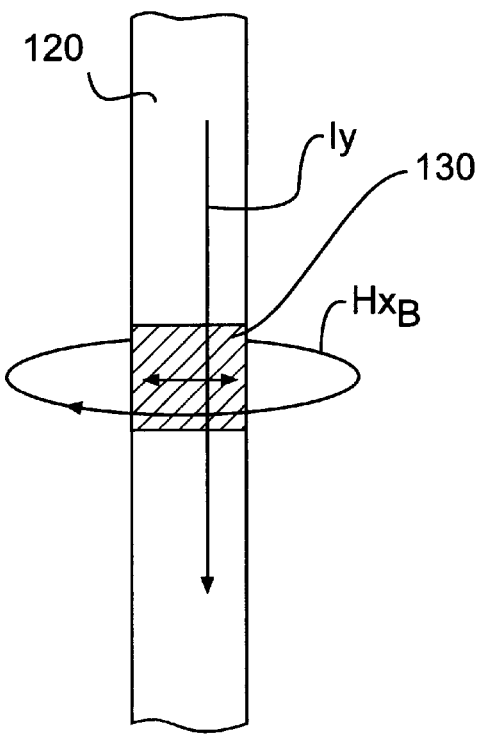
FIG. 7 illustrates a portion of a bit line according to an embodiment of the MRAM memory array.

FIG. 6 illustrates a portion of a word line 110, and the magnetic field $Hx_W$ generated by a current Ix in the word line 110. The subscript "W" indicates that the field $Hx_W$ is generated by the word line 110. FIG. 7 illustrates a portion of a bit line 120, and the magnetic field $Hx_B$ generated by a current Iy in the bit line 120. The subscript "B" indicates that the field $Hx_B$ is generated by the bit line 120.

When the word line 110 and the bit line 120 are arranged in the memory array 100, the portion (in this embodiment, the third leg 116) of the word line 110 extending in the y direction is coextensive in the y direction with a portion of the bit line 120. A memory cell 150 is sandwiched between the word line 110 and the bit line 120 at the memory cell location 130, where the portions are coextensive. At the coextensive portion, the currents Ix and Iy are substantially aligned in the y direction, which means that the fields $Hx_W$ and $Hx_B$ are substantially aligned in the x direction. Therefore, the resultant field strength approximates $Hx_W + Hx_B$. The resultant field is also substantially aligned with the easy axis (two-headed arrow) of the memory cell 150 as it passes through the memory cell 150. Referring to the resultant field as "substantially aligned" with the easy axis indicates that the resultant field has small vector components in the y direction.

Aligning the fields $Hx_W$ and $Hx_B$ and, consequently, the resultant field, with the easy axis reduces the size of the fields $Hx_W$ and $Hx_B$ required to change the direction of magnetization of the data storage layer 152. Therefore, smaller word and bit line currents Ix, Iy can be used to switch the binary state of the memory cell 150, reducing the power consumption of the memory array 100. Smaller word and bit line currents Ix, Iy also mean that smaller word and bit lines 110, 120 can be utilized, increasing the density of the memory array 100, and reducing cost.

Figure 8:
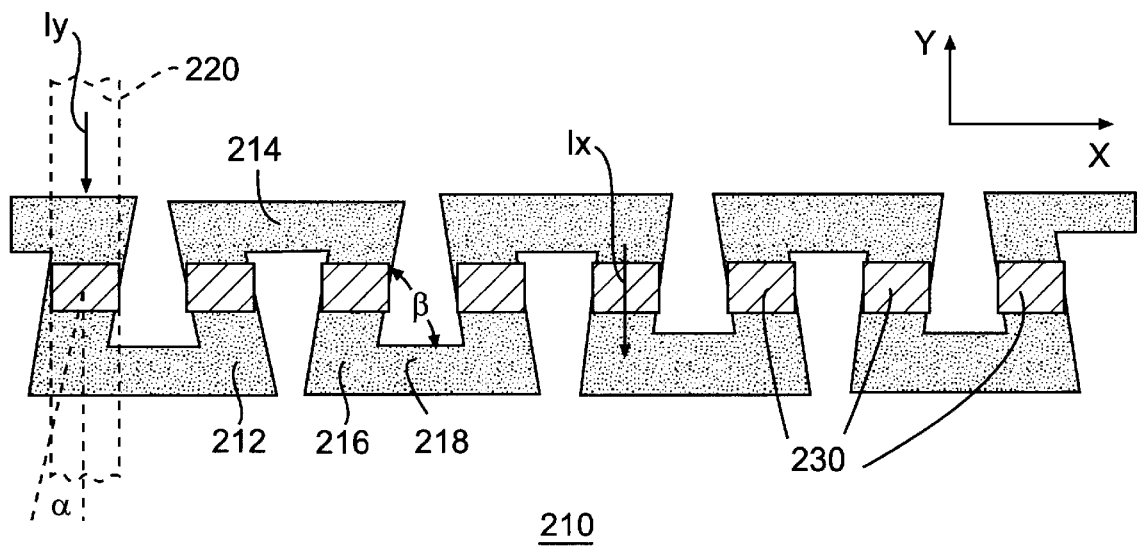
FIG. 8 illustrates an alternative embodiment of a nonlinear word line.

FIG. 8 illustrates a possible alternative embodiment of a nonlinear word line. Referring to FIG. 8, a nonlinear word line 210 includes a repeating series of first, second, third, and fourth legs 212, 214, 216, 218. Each of the first through fourth legs 212, 214, 216, 218 subtends an acute angle β with an adjacent leg. The first legs 212 and the third legs 216 are aligned to cross bit lines 220 (one shown by dotted lines) at memory cell locations 230 (shown in cross-hatching). Because electricity tends to travel the shortest path between locations, the length of the second and fourth legs 214, 218 is increased. Therefore, the current Ix travels essentially in the y direction through the first legs 212 and the third legs 216. This configuration provides better alignment of the magnetic fields $Hx_W$ and $Hx_B$ in the x direction.

Other embodiments of nonlinear word lines may be used in the MRAM memory array illustrated by FIG. 4. For example, the nonlinear word line 110 illustrated in FIG. 5 could include rounded leg portions connecting the portions of the word line 110 that extend in the y direction. Further, the nonlinear word line 110 need not include a portion that is precisely coextensive with a portion of a bit line 120. As illustrated by FIG. 8, the portions of the word line may be offset to some degree to better align the currents in the word and bit lines. The portions may also be oriented at some other nonzero angle a less than the 90 degree angle between word and bit lines in conventional memory cell arrays. For example, the portions may be oriented such that the word and bit line currents are oriented at less than, for example, 45 degrees to one another.

Figure 9:
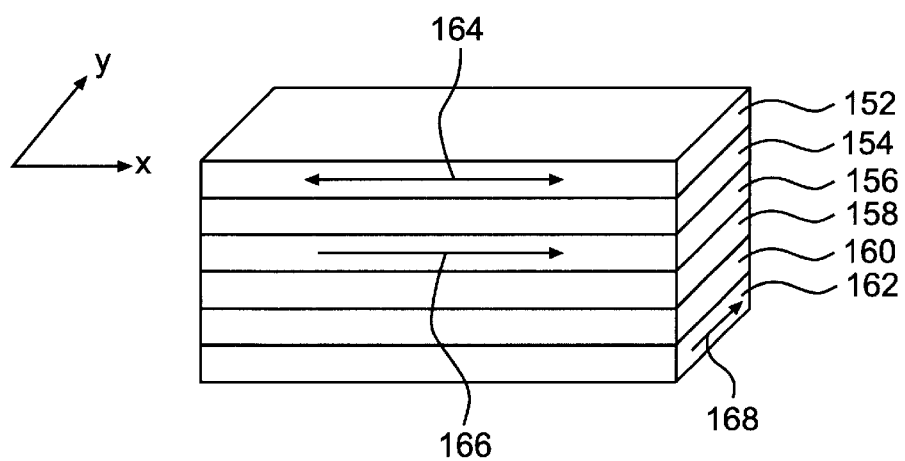
FIG. 9 is a perspective view of a memory cell of the MRAM memory array illustrated in FIG. 4.

FIG. 9 illustrates a memory cell 150 as indicated in FIG. 4. The memory cell 150 may be a spin dependent tunneling ("SDT") device. The memory cell 150 includes a data storage layer 152 having an easy axis 164 of magnetic orientation that is switchable between two binary states. A barrier layer 154 separates the data storage layer 152 from a pinned layer 156. The pinned layer 156 has a magnetization axis 166 that is fixedly oriented so as not to rotate in the presence of an applied magnetic field. If the magnetization of the data storage layer 152 and the pinned layer 156 are in the same direction, the orientation is said to be "parallel." If in opposite directions, the orientation is said to be "antiparallel." These two orientations represent the binary states of "1" and "0", respectively.

The data storage layer 152 and the pinned layer 156 are separated by a barrier layer 154. The barrier layer 154 allows quantum mechanical tunneling to occur between the data storage layer 152 and the pinned layer 156. This tunneling phenomenon is electron spin dependent, making the resistance of the SDT device a function of the relative orientations of the magnetization of the data storage layer 152 and the pinned layer 156.

An antiferromagnetic (AF) pinning layer 158 is provided for pinning the magnetization of the pinned layer 156. A separation layer 160 is provided between the AF layer 158 and a transversely oriented magnetic layer 162. According to an embodiment, the transversely oriented magnetic layer 162 provides a transverse magnetic field in a direction of magnetization 168, which may be aligned with the y axis. Because the word and bit lines may be substantially coextensive in embodiments of the present invention, the transversely oriented magnetic layer 162 may provide the sole transverse magnetic field in the memory cell 150.

A transverse magnetic field is desirable because the transverse magnetic field forces the magnetic field of the data storage layer 152 to rotate consistently in the same quadrant, along a single path. This increases the reproducibility of switching of the memory cell 150. The transverse magnetic field also reduces the amount of current Ix and Iy required to switch the memory cell 150. Reducing the switching currents Ix and Iy provides the added advantage of increased memory cell density, because smaller word and bit lines can be utilized.

According to the above embodiment, the transverse magnetic field can be applied constantly, and therefore the transversely oriented magnetic layer 162 can be constructed of a layer of permanent magnet. Therefore, no current is required to generate the transverse magnetic field, which reduces the power requirement of the memory array. As an alternative, the transversely oriented magnetic layer 162 can comprise a layer of pinned transverse magnetization, and a pinning layer of antiferromagnetic material to pin the magnetization of the pinned layer.

The transversely oriented magnetic layer 162 may be made of a variety of magnetic materials. For example, the transversely oriented magnetic layer 162 may be made of an alloy of cobalt and chromium. The transversely oriented magnetic layer 162 can be set at room temperature by applying a large magnetic field in the transverse direction. The thickness of the transversely oriented magnetic layer 162 is selected to provide the required transverse magnetic field.

The memory cell 150 used in the MRAM memory array 100 is not the only type of memory cell appropriate for use in the MRAM memory array 100. For example, other types of memory cells, such as giant magnetoresistance (GMR) devices, may also be used in the MRAM memory array 100.

The MRAM memory array 100 could be used in a wide variety of applications. One general application may be embodied by a machine having an MRAM storage module. The MRAM storage module may include one or more MRAM memory arrays for long term storage.

For a machine such as a notebook computer or personal computer, an MRAM storage module might include a number of MRAM memory arrays. In an application such as a server, an MRAM storage module might include a large number of MRAM memory arrays. Such MRAM storage modules could replace or supplement conventional long term storage devices such as hard drives.

While the MRAM memory array is described with reference to exemplary embodiments, many modifications will be readily apparent to those skilled in the art, and the present disclosure is intended to cover variations thereof.

What is claimed is:

1. An MRAM memory array comprising:
    an array of memory cells;
    a plurality of nonlinear word lines extending in a first direction; and
    a plurality of substantially linear bit lines extending in a second direction, wherein the word lines cross the bit lines at a plurality of memory cell locations and the memory cells are located at the memory cell locations between the word lines and the bit lines, and wherein portions of the word lines are substantially coextensive with portions of the bit lines at the memory cell locations.

2. The MRAM memory array of claim 1, wherein the word lines comprise:
    a plurality of legs connected end-to-end and disposed at an angle to one another.

3. The MRAM memory array of claim 2, wherein each leg is substantially orthogonal to an adjacent leg.

4. The MRAM memory array of claim 2, wherein each leg subtends an acute angle with an adjacent leg.

5. The MRAM memory array of claim 1, wherein the portions of the word lines are parallel to the portions of the bit lines at the memory cell locations.

6. An MRAM memory array comprising:
    an array of memory cells;
    a plurality of nonlinear word lines extending in a first direction; and
    a plurality of substantially linear bit lines extending in a second direction, wherein the word lines cross the bit lines at a plurality of memory cell locations and the memory cells are located at the memory cell locations, and wherein each memory cell produces a transverse magnetic field in the second direction.

7. The MRAM memory array of claim 6, wherein each memory cell comprises:
    a transversely oriented magnetic layer that produces the transverse magnetic field.

8. The MRAM memory array of claim 7, wherein each memory cell comprises:
    a data storage layer having an easy axis; and
    a pinned layer, wherein the transverse magnetic field is transverse to the easy axis.

9. The MRAM memory array of claim 7, wherein the transversely oriented magnetic layer comprises one of a permanent magnetic layer and a layer of pinned magnetization.

10. The MRAM memory array of claim 1, wherein the word lines are arranged to receive word currents, and the bit lines are arranged to receive bit currents, a word current being disposed at an angle of less than 45 degrees to a bit current at a memory cell location.

11. An MRAM memory array, comprising:
    a plurality of memory cells;
    a plurality of nonlinear word lines extending in a first direction and each word line arranged to receive a first current; and
    a plurality of bit lines extending in a second direction and each bit line arranged to receive a second current, wherein the word lines cross the bit lines at memory cell locations and the memory cells are located at the memory cell locations between the word and bit lines, and wherein the first current is oriented at an angle of less than 45 degrees to the second current at the memory cell location.

12. The MRAM memory array of claim 11, wherein the word lines comprise:
   a plurality of legs connected end-to-end and disposed at an angle to one another.

13. An MRAM memory array, comprising:
   a plurality of memory cells, each memory cell comprising a transversely oriented magnetic layer that produces a transverse magnetic field in a second direction;
   a plurality of word lines extending in a first direction and each word line arranged to receive a first current; and
   a plurality of bit lines extending in the second direction and each bit line arranged to receive a second current, wherein the word lines cross the bit lines at memory cell locations and the memory cells are located at the memory cell locations, and wherein a first current is oriented at an angle of less than 45 degrees to a second current at a memory cell location.

14. The MRAM memory array of claim 13, wherein each memory cell comprises:
   a data storage layer having an easy axis; and
   a pinned layer, wherein the transverse magnetic field is oriented substantially orthogonal to the easy axis.

15. The MRAM memory array of claim 11, wherein the first current is substantially aligned with the second current at the memory cell location.

16. An MRAM memory array, comprising:
   an array of memory cells, each memory cell comprising:
      a data storage layer having an easy axis;
      a pinned layer; and
      a transversely oriented magnetic layer that produces a transverse magnetic field substantially orthogonal to the easy axis;
   a plurality of word lines extending in a first direction, each word line comprising a plurality of legs connected end-to-end and disposed at an angle to one another; and
   a plurality of substantially linear bit lines extending in a second direction, wherein the word lines cross the bit lines at a plurality of memory cell locations and the memory cells are located at the memory cell locations, portions of the word lines being substantially coextensive with portions of the bit lines at the memory cell locations.

17. The MRAM memory array of claim 16, wherein each of the plurality of word lines is arranged to receive a word current, and each of the plurality of bit lines is arranged to receive a bit current, and wherein the word currents are substantially aligned with the bit currents at the memory cell locations.

18. The memory array of claim 1, wherein each memory cell comprises:
   a data storage layer having an easy axis; and
   a pinned layer having a magnetization axis of fixed orientation.

19. The memory array of claim 11, wherein each memory cell comprises:
   a data storage layer having an easy axis; and
   a pinned layer having a magnetization axis of fixed orientation.

* * * * *